United States Patent [19]

Congleton et al.

[11] Patent Number: 5,007,576

[45] Date of Patent: Apr. 16, 1991

[54] TESTABLE RIBBON BONDING METHOD AND WEDGE BONDING TOOL FOR MICROCIRCUIT DEVICE FABRICATION

[75] Inventors: Helen Congleton, Huntington Beach; Carol L. Slaton, Irvine; Angelo Koudounaris, Hermosa Beach; Gerald B. Smith, Huntington Beach; Vicente Soto, Riverside, all of Calif.

[73] Assignee: Hughes Aircraft Company, Los Angeles, Calif.

[21] Appl. No.: 456,446

[22] Filed: Dec. 26, 1989

[51] Int. Cl.⁵ .................. B23K 101/36; H05K 3/32; H01L 21/603

[52] U.S. Cl. ............................. 228/103; 228/104; 228/173.5; 228/179; 29/843; 29/844

[58] Field of Search ............ 228/179, 103, 104, 173.1, 228/173.2, 173.5, 904; 29/843, 844

[56] References Cited

U.S. PATENT DOCUMENTS

| | | | |
|---|---|---|---|
| 3,476,986 | 11/1969 | Tsuji | 228/179 |
| 4,068,371 | 1/1978 | Miller | 228/179 |
| 4,142,288 | 3/1979 | Flammer et al. | 228/173.5 |

OTHER PUBLICATIONS

Riches, Steve; "Ribbon Bonding for Device Interconnection"; Welding Institute Technology Bulletin; Nov./Dec. 1989; p. 15.

Primary Examiner—Sam Heinrich
Attorney, Agent, or Firm—Terje Gudmestad; W. K. Denson-Low

[57] ABSTRACT

An electrical circuit component is temporarily fixed to a temporary substrate. Electrical contacts on the component are interconnected with corresponding contacts on the test substrate by lead wires or ribbons using a bonding wedge that forms the lead wires into a gullwing shape with central portions thereof formed adjacent to edge portions of the component. The component is subjected to a test procedure while fixed to the temporary substrate via signals applied to the contacts thereof. The lead wires are then severed near their connection to the temporary substrate, and the component with the remaining lead wire portions attached is removed from the test substrate. The lead wires are sufficiently stiff and/or are adhered to the edge portions of the component with an adhesive so as retain their shapes after removal of the component from the temporary substrate. The component is then adhered to a permanent device substrate, and the ends of the lead wires are bonded to corresponding contacts on the device substrate.

17 Claims, 5 Drawing Sheets

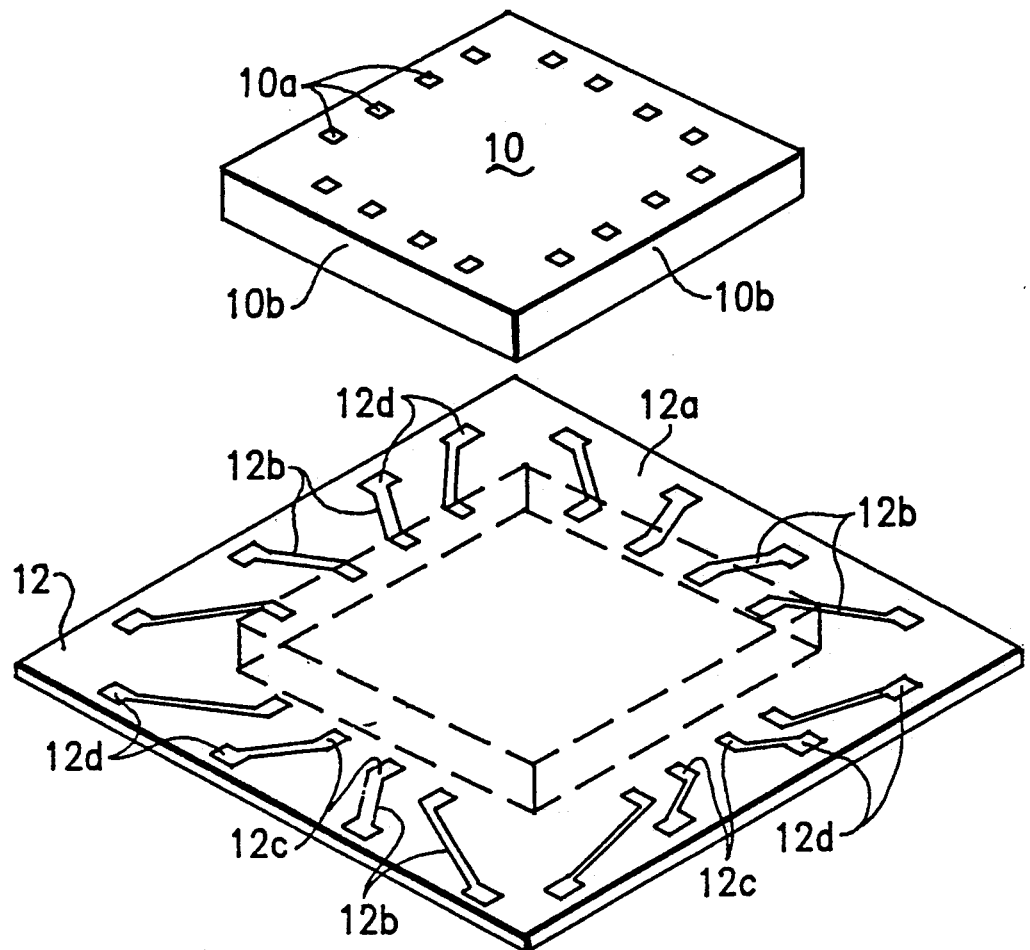
Fig.1.a.
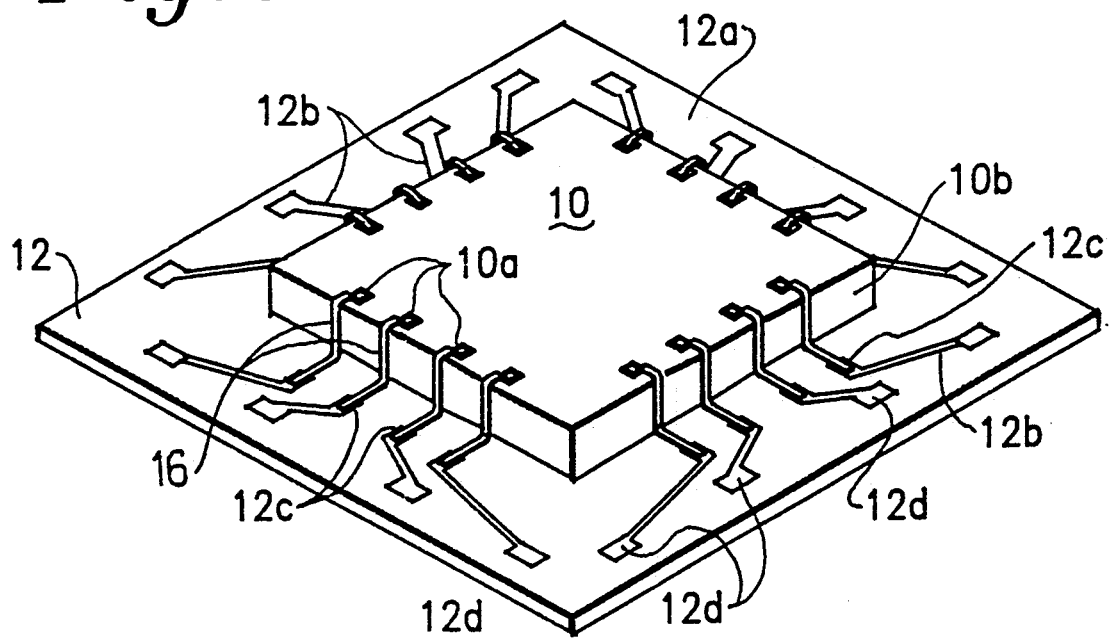
Fig.1.b.

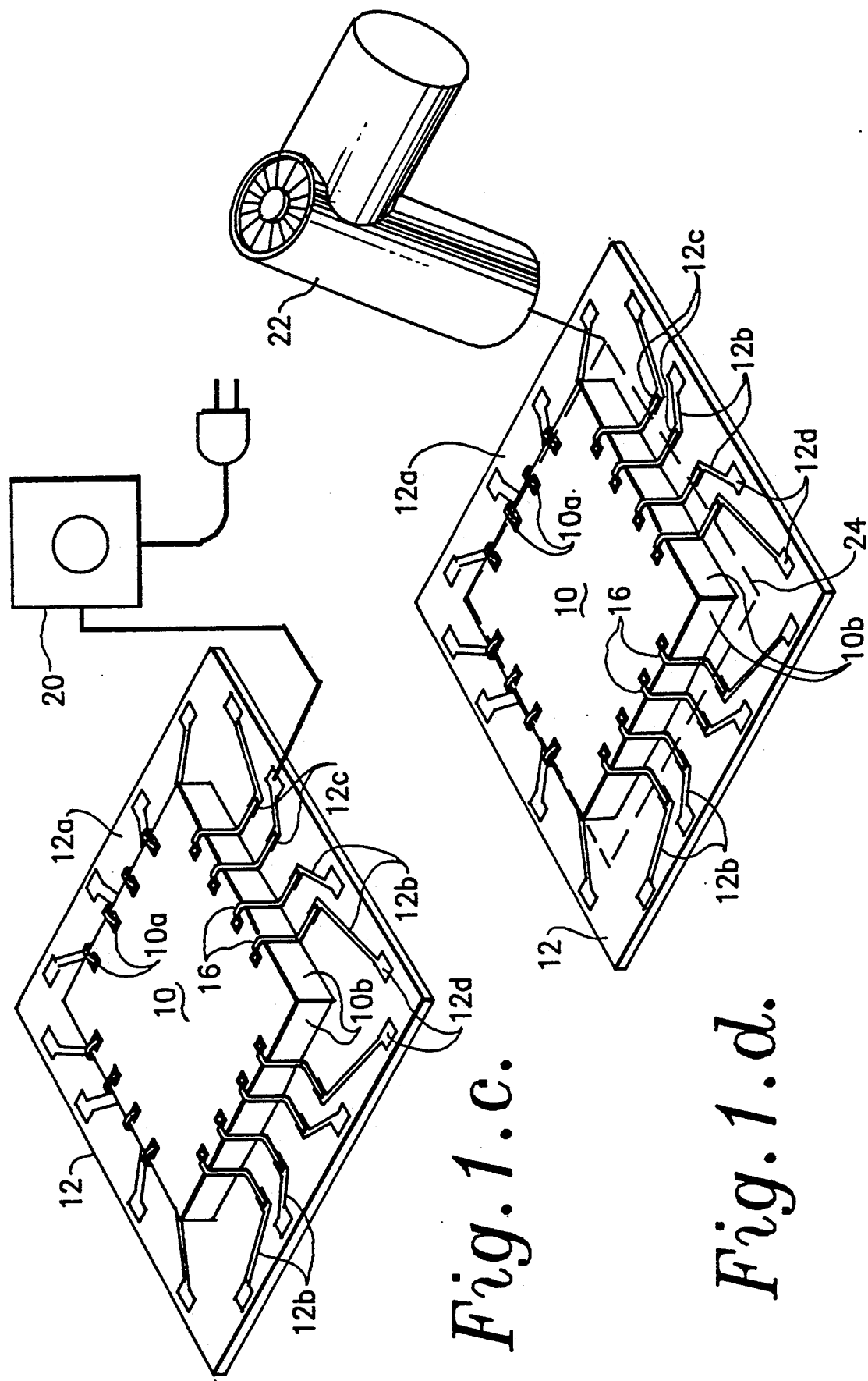

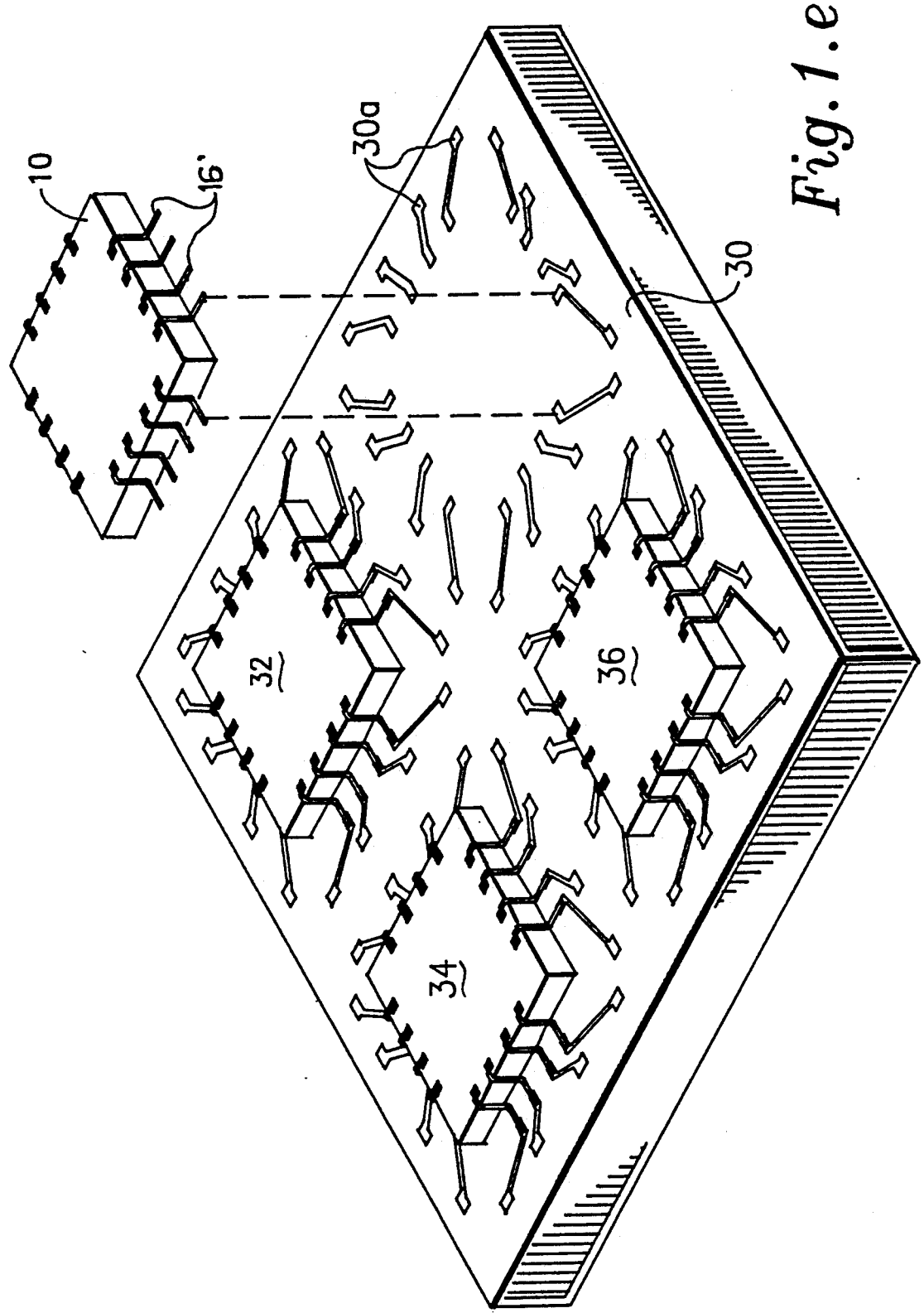
Fig. 1.e.

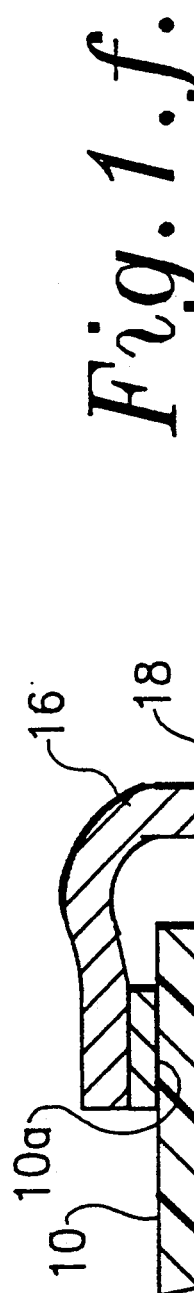
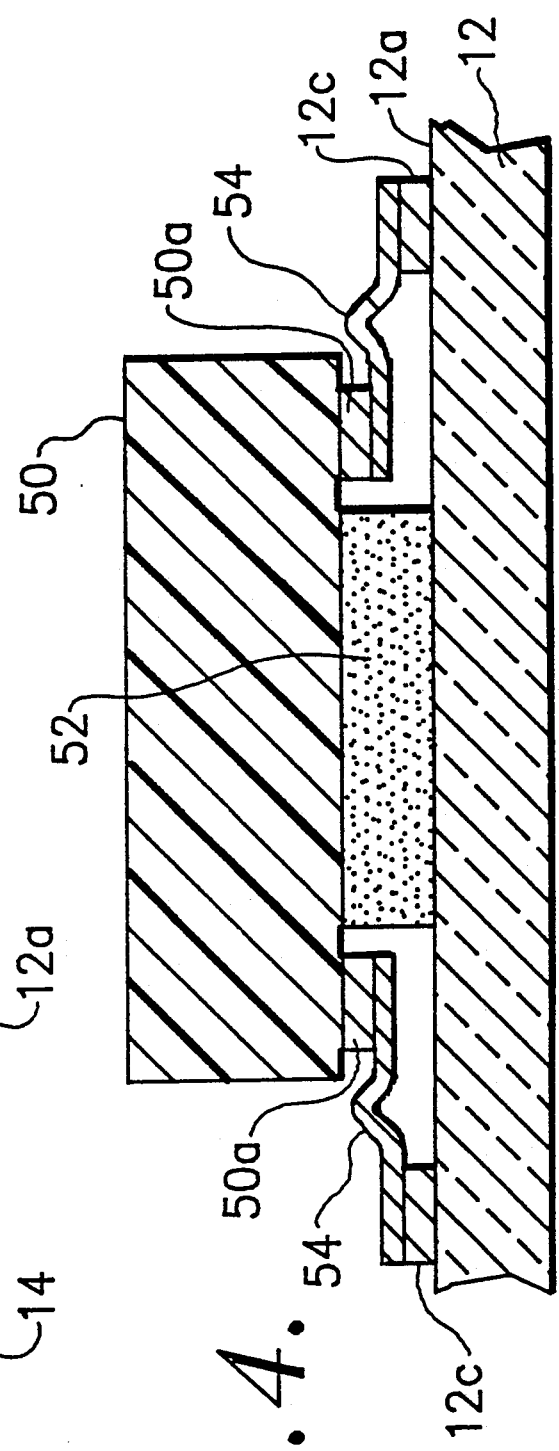

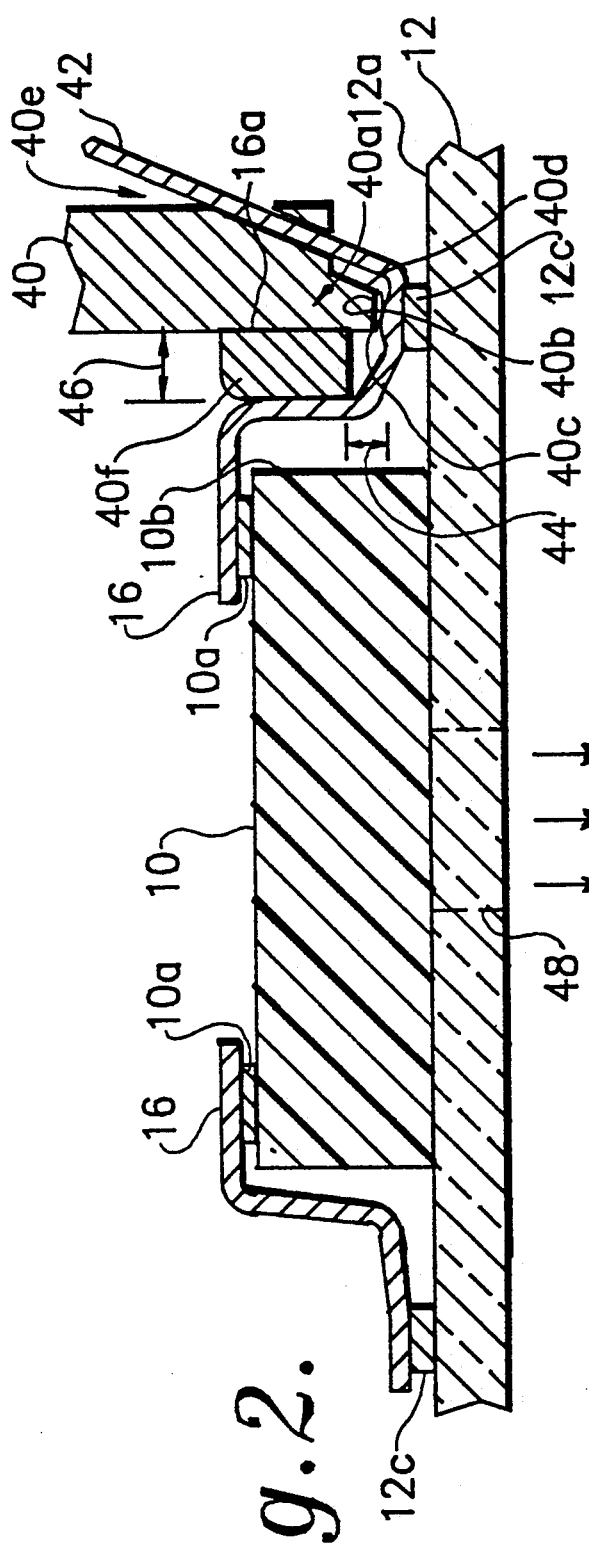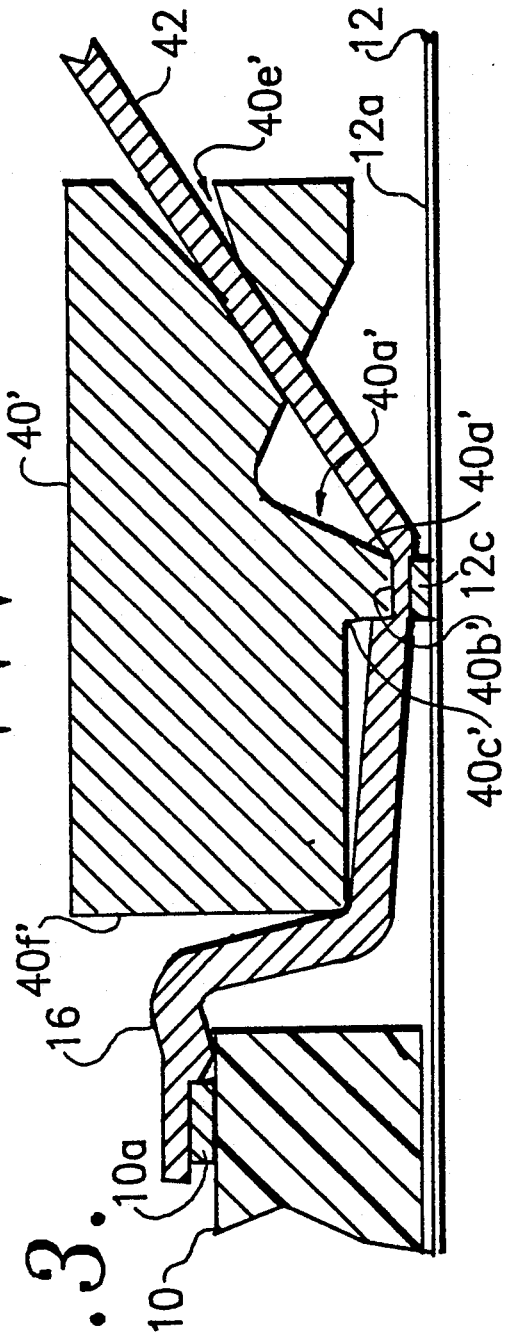

TESTABLE RIBBON BONDING METHOD AND WEDGE BONDING TOOL FOR MICROCIRCUIT DEVICE FABRICATION

BACKGROUND OF THE INVENTION

1. Field of the Invention

The present invention generally relates to the art of microcircuit device fabrication, interconnection, and testing, and more specifically to a method for attachment of multi-contact electrical components to substrates using ribbon bonding, which enables the components to be tested prior to final assembly.

2. Description of the Related Art

High density microcircuit devices, including hybrid microcircuits, may be fabricated by providing a substrate with a pattern of electrical interconnect metallizations formed thereon, adhering electrical components or devices to the substrate, and interconnecting contacts on the devices to corresponding contacts on the substrates by wire or ribbon leads. This has been conventionally accomplished by wedge or gold ball bonding, using pressure, heat, ultrasonic energy, and/or a combination thereof.

In wedge bonding, a tool is positioned such that a direction of supply of gold or aluminum wire or ribbon from a spool is aligned with a contact on a device and a corresponding contact on a substrate. The wire extends under the wedge bonding tool foot. The tool is positioned over the contact on the device and lowered to press the wire onto the contact for a predetermined dwell time and force to form an inner bond. The tool is then raised, moved into position over the contact on the substrate, and then lowered to press the wire onto the contact to form an outer bond. After forming the resulting interconnection, the tool is raised, and a clamp tugs off the wire from the second bond and shoves the wire back under the bonding tool foot, readying it for the next bond. The cycle is essentially the same for ultrasonic, thermocompression, or thermosonic wedge bonding.

Ball bonding is similar to wedge bonding except that gold wire is used exclusively, and the end of the wire is formed into a ball which is bonded into a "nailhead" configuration. A key advantage of ball bonding over wedge bonding is the freedom of movement of the bonding tool; it can be moved in any direction after the first bond is formed.

The increasing complexity of integrated circuit (IC) devices, especially hybrid microcircuits, and the density of multichip circuits, mandate electrical testing of individual components and devices prior to assembly. This is necessary to ensure acceptable yields and reduce costly fault isolation and replacement of bad devices. Without this ability, the overall cost of hybrid microcircuits would be increased due to extensive re-work cycles and the possibility of damaging substrates or adjacent devices.

One known approach to enable pre-testing of devices prior to final assembly is to utilize tape automated bonding (TAB). This process, as well as wedge and gold ball bonding, is described in a textbook entitled "HYBRID MICROCIRCUIT TECHNOLOGY HANDBOOK", by J. Licari et al, Noyes Publications, Park Ridge, NJ, 1988, pp. 191-208. A device is first bonded to a plated copper/polyimide tape carrier, and then electrically tested and burned in. After testing, the device on the tape is excised and assembled into a hybrid package.

The TAB process is subject to a number of limitations, including the necessity of providing dedicated and expensive equipment for each process step. A long lead time and high cost are associated with providing specially designed tape carriers for each IC type. The tape materials must be developed to meet burn-in requirements without warping or stressing inner bonds. Hard tooling is required to excise and form TAB leads. Multiple bonds are placed on the same IC bond pad to accomplish single point bumping and inner lead bonding. In addition, bumping is required to provide a bonding surface above the passivation layer, and ICs must be available in wafer form to plate the bump with a barrier layer.

A second approach to enable device testing prior to final assembly is to wire bond a device with long wires into a temporary test package. This is done with a regular wirebonder, and there is no special technology to hold the alignment of the wires. The device is tested, burned-in, and the wires are cut. The device is then mounted in the final hybrid microcircuit package, the wires are aligned to the hybrid contacts by hand, and are then bonded. This process is difficult (special operator skills are required), and it is not suitable for production. Also, the inner lead bond is not protected from extra stress throughout the process.

SUMMARY OF THE INVENTION

The present invention provides a process and apparatus which enables full testing, electrical characterization, and burn-in of ICs without hard tooling, and is suitable for production. The invention further provides a fast-turn-around method to screen out ICs that are marginal or defective before installation into a hybrid microcircuit.

The drawbacks of the TAB process are overcome if a unique tape carrier is not required for each IC. Without using a tape carrier, it is possible to eliminate the hard tooling required for the TAB process, such as excising and forming tooling. Carriers and tape insertion equipment are also not needed. Since it is not required to bond the tape leads to the IC bond pads, it is not necessary to bump the chips.

The present invention overcomes these drawbacks utilizing ribbon or wire bonding. The present process is much lower in cost than the TAB process, does not require any custom treatment of standard IC bond pad metallization, and may be automated for production.

In order to meet the requirement for pre-testing of components and devices prior to final assembly, the present invention provides a method for temporarily attaching a component to a test substrate, and ribbon or wire bonding the component to the metallizations on the substrate. The ribbon or wire leads are stiff enough to retain alignment with the component, and/or are adhered thereto to maintain the alignment. After testing and burn-in, the bonds are cut. The component with the remaining portions of the leads attached is removed from the test substrate and mounted on the final hybrid device substrate, and the outer leads are bonded to the substrate to provide the circuit interconnections.

More specifically, an electrical circuit component is temporarily fixed to a temporary substrate. Electrical contacts on the component are interconnected with corresponding contacts on the test substrate by lead wires or ribbons using a bonding wedge that forms the lead wires into a gull-wing shape with central portions thereof formed adjacent to edge portions of the component and surface of the substrate. The component is subjected to a test procedure while fixed to the temporary substrate via signals applied to the contacts thereof. The lead wires are then severed near their connection to the temporary substrate, and the component with the remaining lead wire portions attached is removed from the test substrate. The lead wires are sufficiently stiff and/or are adhered to the edge portions of the component with an adhesive so as retain their shapes and alignment after removal of the component from the temporary substrate. The component is then adhered to a permanent device substrate, and the ends of the lead wires are bonded to corresponding contacts on the device substrate.

The present invention provides a method as summarized above, a specially designed ribbon wire bonding wedge for use in performing the method, and a device fabricated in accordance with the method.

These and other features and advantages of the present invention will be apparent to those skilled in the art from the following detailed description, taken together with the accompanying drawings, in which like reference numerals refer to like parts.

DESCRIPTION OF THE DRAWINGS

FIGS. 1a to 1e are simplified perspective views illustrating a testable ribbon bonding method embodying the present invention;

FIG. 1f is a fragmentary sectional view illustrating a ribbon bonding step of the present method;

FIG. 2 is a sectional view further illustrating the ribbon bonding step and a modified ribbon bonding wedge tool for performing the step;

FIG. 3 is similar to FIG. 2, but illustrates another modified ribbon bonding wedge tool; and FIG. 4 is a sectional view illustrating a modification of the present method for attachment of a device in an inverted configuration.

DETAILED DESCRIPTION OF THE INVENTION

Referring now to FIG. 1a of the drawing, the testable ribbon bonding method of the present invention includes providing an electrical component 10 and a temporary test substrate 12. The component 10 may be a discrete element, a hybrid microcircuit die, an integrated circuit chip, or any other electrical element which is to be mounted on a circuit board or substrate. The component 10 may have a plurality of electrical contacts 10a formed on an upper surface thereof, which lead to internal circuit connections (not shown).

The temporary substrate 12 includes a circuit board 12a formed of an electrically insulative material, and a plurality of metallizations 12b for providing connections to electrical test equipment as will be described below. Inner end portions of the metallizations 12b constitute electrical contacts 12c, which correspond and are conjugate to the contacts 10a of the component 10. Contact pads 12d are formed at the outer ends of the metallizations 12b, for connection to external test equipment.

In FIG. 1b, the component 10 is removably fixed to the substrate 12 with the contacts 10a aligned with the contacts 12c. This may be accomplished by means of a temporary adhesive 14, as shown in FIG. 1f, vacuum applied through a hole formed through the substrate 12 as will be described in detail below, or any other suitable means. The adhesive 14 may be of any appropriate type, including thermoplastic polymer, acrylic, polyester, polyimide, or high purity cyanoacrylate.

After the component 10 is mounted on the substrate 12, the contacts 10a are electrically connected to the corresponding contacts 12c by means of ribbon or wire leads 16 made of, for example, aluminum, silver, copper, or gold. The leads 16 are bonded at their opposite ends to the respective contacts 10a and 12c, and formed or dressed adjacent to portions of side walls or edges 10b in a "gull-wing" shape. The edges 10b are substantially perpendicular to the upper surface of the component 10 on which the contacts 10a are provided. As shown in FIG. 1f, central portions 16a of the leads 16 are bent around the corners between the upper surface of the component 10 and the edges 10b thereof, and formed adjacent to the edges 10b. The shape of the leads 16 is selected to enable automation of conventional processing steps, including cutting and pick-and-place. The leads 16 may be bonded to the contacts 10a and 12c using any appropriate method, including wedge or gold ball bonding.

The central portions 16a of the leads 16 may be adhered to the edges 10b of the component 10 by an appropriate adhesive 18, or any other electrically insulative fixing means. If desired, the adhesive may be provided as a paste or pre-stamped material, and immobilize the leads 16 relative to each other without adhering to the component 10. Alternatively, the leads 16 may be made of wire or ribbon which is stiff enough to retain its shape after the ends of the leads 16 which are bonded to the contacts 12c are severed. A combination of 1×3 mil ribbon leads with a 12 mil component mounting pitch has been determined to provide sufficient stiffness for practicing the present method.

As illustrated in FIG 1c, the component 10 is subjected to electrical testing, burn-in, and/or any other required pre-assembly operation. A piece of electrical test equipment 20 is symbolically shown as being connected to the metallizations 12b of the test substrate 12 to apply electrical signals to the component 10 via the contacts 12c, leads 16, and contacts 10a, and sense the operation of the component 10 in response to the applied signals.

The next step of the method is shown in FIG. 1d, in which the leads 16 are shown as being severed by a beam from a laser 22. Alternatively, the leads 16 may be severed by a mechanical tool, which may be automated by implementation on an automatic bonder (not shown). The leads 16 are severed at positions indicated at 24 near their points of connection to the contacts 12c of the test substrate 12.

After all of the leads 16 have been severed, the component 10 is excised or removed from the test substrate 12, with the remaining portions of the leads 16, designated as 16' in FIG. 1e, attached to the component 10. In accordance with an important feature of the invention, the leads 16' retain their shape and alignment relative to the component 10 and each other, due to the stiffness of the leads 16' and/or the adhesion thereof to the component 10. Where vacuum is used to temporarily fix the component 10 to the substrate 12, the removal of the component 10 may be facilitated by removing the vacuum or decreasing the level thereof. Where the adhesive 14 is used to fix the component 10 to the substrate 12, removal may be effected by heating the adhesive to soften the same, or dissolving the adhesive in a solvent, depending on the particular type of adhesive used. In all cases, care must be taken to avoid disturbing the alignment of the leads 16' while removing the component 10 from the substrate 12. Preferably, component removal is automated in combination with the other process steps using pick-and-place tooling (not shown).

FIG. 1e illustrates the component 10, with the leads 16' attached thereto, being positioned for final assembly on a device substrate 30. The substrate 30 may be a hybrid microcircuit package, or any other structure for incorporating the component 10 into a useful electronic unit. The substrate 30 is formed with electrical contacts 30a conjugate to the contacts 10a of the component 10, which interconnect with metallizations (not shown) for connection of the component 10 to other components or devices 32, 34, and 36 mounted on the substrate 30. The component 10 is fixed to the substrate 30 using an appropriate adhesive or other mounting means, with the leads 16' aligned with the contacts 30a. Final assembly is completed by bonding the end portions of the leads 16' to the respective contacts 30a. Mounting of the component 10 on the device substrate 30 may be performed in-line with excising of the component 10 from the test substrate 12 to avoid excessive handling. The leads 16' are preferably bonded to the contacts 30a simultaneously using an outer lead bonding tool (not shown).

FIG. 2 illustrates a ribbon wire wedge bonding tool 40 which is advantageous for practicing the present method step shown in FIG. 1b. The tool 40 has a lower end portion formed into the shape of a foot 40a having a bottom 40b defined between a front edge 40c and a back edge 40d of the foot 40a. The length of the bottom 40b constitutes the bonding length of the tool 40. The tool 40 is formed with a slot 40e for guiding ribbon wire 42 from a spool (not shown) under the bottom 40b of the foot 40a from the back edge 40d thereof.

In accordance with the present invention, the tool 40 is modified to include an extension 40f, which is fixed to and extends forwardly from the front edge 40c of the foot 40a. The extension 40f is spaced from the bottom 40b of the foot 40a by a selected distance 44, and extends out from the front edge 40c by a selected distance 46. The distances 44 and 46 are selected such that the ribbon wire 42 is formed into the desired gull-wing or other desired shape to constitute the lead 16 during conventional wedge bonding of the lead 16 to the contacts 10a and 12c. The length of the extension 40f, constituted by the distance 46, is selected in accordance with the distance between the contact 12c and the corresponding edge 10b of the component 10 so that the central portion 16a of the lead 16 is formed or dressed adjacent to the edge 10b, and downwardly along the surface of the substrate 12 to the contact 12c.

The lead 16 is formed using the tool 40 in a conventional manner, except that the gull-wing shape is automatically formed due to the provision of the extension 40f. The wire ribbon 42 is first bonded to the contact 10a, the tool 40 is retracted to bond the wire 42 to the contact 12c, and the wire 42 is cut to form the completed lead 16.

Further illustrated in FIG. 2 is a hole 48 formed through the test substrate 12, through which vacuum may be applied to temporarily fix the component 10 to the substrate 12.

Although it is within the scope of the invention to wedge or ball bond the leads 16 to the component 10 and test substrate 12 using a conventional tool which does not include the extension 40f, and subsequently form the leads 16 into the gull-wing shape, this is a less preferred method of practicing the invention due to the increased possibility of damaging the leads 16.

FIG. 3 illustrates a modification of the wedge bonding tool 40, with corresponding parts thereof designated by the same reference numerals primed. The tool 40' is similar to the tool 40, except that the extension 40f' is formed as an integral part thereof rather than being fixed to the front edge 40c'. The extension length is fixed or formed in accordance with the required IC's substrate design. The extension 40f' is longer than the extension 40f to accommodate a larger distance between the contact 12c and the edge 10b of the component 10. In addition, the slot 40e' is inclined at an angle of 45°, as compared to the slot 40e which is inclined at an angle of 60°. The angle may have any value selected in accordance with the type of wedge bonder used (30°, 50°, 90°, etc.)

The present invention is also applicable for assembly of components in a "flip-chip", or inverted configuration as illustrated in FIG. 4. A component 50 is mounted on the test substrate 12 with contacts 50a facing the surface of the substrate 12, by means of an adhesive 52 which is sufficiently thick to space the contacts 50a from the substrate 12. The contacts 50a are interconnected with the contacts 12c by wire or ribbon leads 54. If desired, the leads 54 may have a stress relief form if required for a specific application, as illustrated.

Prior to mounting of the component 50 on the test substrate 12, the component 50 is placed in a cavity (not shown) with the contacts 50a facing upwardly. The leads 54 are bonded to the contacts 10a in this configuration. Then, the component 50 is removed from the cavity, inverted, and fixed to the substrate 12 as shown in FIG. 4 with the contacts 50a aligned with the contacts 12c. The leads 54 may then be bonded to the contacts 12c simultaneously using an outer lead bonding tool. Due to the inverted configuration illustrated in FIG. 4, forming of the leads 54 into a gull-wing shape is not appropriate.

While several illustrative embodiments of the invention have been shown and described, numerous variations and alternate embodiments will occur to those skilled in the art, without departing from the spirit and scope of the invention. Accordingly, it is intended that the present invention not be limited solely to the specifically described illustrative embodiments. Various modifications are contemplated and can be made without departing from the spirit and scope of the invention as defined by the appended claims.

We claim:

1. A method of fabricating an electrical device, comprising the steps of:
    (a) providing an electrical circuit component having a plurality of electrical contacts;
    (b) providing a temporary substrate having a plurality of electrical contacts conjugate to the contacts of the component respectively;
    (c) removably fixing the component to the temporary substrate with the respective contacts in mutual alignment;
    (d) electrically connecting the contacts of the component to the respective contacts of the temporary substrate with lead wires in such a manner that portions of the lead wires connected to the component will substantially retain their shapes relative to the component after the lead wires are severed from the temporary substrate near points of connection of the lead wires to the contacts of the temporary substrate;

(e) severing the lead wires near said points of connection, leaving said portions thereof extending outwardly from the component; and (f) removing the component from the temporary substrate.

2. A method as in claim 1, further comprising the step, performed between steps (d) and (e), of:

(g) performing a predetermined test procedure on the component while it is fixed to the temporary substrate.

3. A method as in claim 1, in which step (c) includes removably fixing the component to the temporary substrate by applying vacuum to the component through a conjugate hole formed through the temporary substrate.

4. A method as in claim in which step (c) includes removably fixing the component to the temporary substrate using a releasable adhesive.

5. A method as in claim 1, further comprising the steps, performed after step (f), of:

(g) providing a device substrate having a plurality of electrical contacts conjugate to the contacts of the component respectively;

(h) fixing the component to the device substrate with said portions of the lead wires extending from the component aligned with respective electrical contacts of the device substrate; and (i) electrically connecting said portions of the lead wires to the respective contacts of the device substrate.

6. A method as in claim 1, in which step (d) further comprises adhering the lead wires to the component.

7. A method as in claim 1, in which step (d) further comprises forming central portions of the lead wires adjacent to edge portions of the component.

8. A method as in claim 7, in which:

step (d) further includes adhering the central portions of the lead wires to the edge portions of the component; and step (e) includes severing the lead wires between points of adhesion thereof to the component and the contacts of the temporary substrate.

9. A method as in claim 7, in which step (d) comprises forming the lead wires into a gull-wing shape.

10. A method as in claim 1, in which step (d) comprises providing the lead wires with sufficient stiffness so that said portions thereof will retain their shapes relative to the component after the lead wires are severed from the temporary substrate.

11. A method as in claim 10, in which step (d) comprises providing the lead wires in the form of ribbon wires, and bonding the opposite ends of each ribbon wire to the respective contacts of the component and temporary substrate.

12. A method as in claim 1, in which step (d) comprises wedge bonding the opposite ends of each lead wire to the respective contacts of the component and temporary substrate using a bonding wedge shaped to form central portions of the lead wires adjacent to the edge portions of the component.

13. A method as in claim 12, in which step (d) comprises providing the bonding wedge shaped to form the lead wires into a gull-wing shape.

14. A method as in claim 12, in which step (d) comprises providing the bonding wedge having an extension above a front edge of a foot thereof shaped to form the central portions of the lead wires adjacent to edge portions of the component.

15. A method as in claim 12, in which step (d) comprises providing the lead wires in the form of ribbon wires.

16. A method as in claim 1, in which step (e) comprises using a laser beam to sever the lead wires.

17. A method as in claim 1, in which step (d) comprises applying adhesive means to the lead wires to retain the lead wires in alignment relative to each other.

* * * * *